(12) United States Patent
Fujimura

(10) Patent No.: US 12,081,219 B2
(45) Date of Patent: Sep. 3, 2024

(54) PHASE INTERPOLATION CIRCUIT, RECEPTION CIRCUIT, AND SEMICONDUCTOR INTEGRATED CIRCUIT

(71) Applicant: Socionext Inc., Kanagawa (JP)

(72) Inventor: Takuya Fujimura, Kanagawa (JP)

(73) Assignee: SOCIONEXT INC., Yokohama (JP)

( * ) Notice: Subject to any disclaimer, the term of this patent is extended or adjusted under 35 U.S.C. 154(b) by 0 days.

(21) Appl. No.: 18/318,303

(22) Filed: May 16, 2023

(65) Prior Publication Data
US 2023/0299758 A1    Sep. 21, 2023

Related U.S. Application Data

(63) Continuation of application No. PCT/JP2020/045100, filed on Dec. 3, 2020.

(51) Int. Cl.
| H03K 5/13 | (2014.01) |
| H03D 7/00 | (2006.01) |
| H04L 25/03 | (2006.01) |

(52) U.S. Cl.
CPC ............. *H03K 5/13* (2013.01); *H03D 7/00* (2013.01); *H04L 25/03057* (2013.01)

(58) Field of Classification Search
CPC ...... H03K 5/13; H03D 7/00; H04L 25/03057; H03B 27/00; H03L 7/081
USPC ........................................................ 327/293
See application file for complete search history.

(56) References Cited

U.S. PATENT DOCUMENTS

| 6,452,432 B2 * | 9/2002 | Kim ................. H03L 7/0816 327/158 |
| 6,677,792 B2 * | 1/2004 | Kwak ............... H03L 7/0816 327/158 |
| 7,142,026 B2 * | 11/2006 | Kwak ............... H03L 7/0816 327/158 |

(Continued)

FOREIGN PATENT DOCUMENTS

| JP | 2009-005214 A | 1/2009 |
| JP | 2009-218931 A | 9/2009 |

(Continued)

OTHER PUBLICATIONS

International Search Report (ISR) dated Jan. 19, 2021 issued in International Patent Application No. PCT/JP2020/045100, with English translation.

(Continued)

*Primary Examiner* — Ryan Jager
(74) *Attorney, Agent, or Firm* — Rimon P.C.

(57) ABSTRACT

A phase interpolation circuit includes: a first buffer circuit configured to adjust a rise time or a fall time of a first reference clock signal based on a first control signal to generate a first input clock signal; a second buffer circuit configured to adjust a rise time or a fall time of a second reference clock signal based on a second control signal to generate a second input clock signal; a detection circuit configured to detect a rise time or a fall time of the first input clock signal or the second input clock signal and generate the first control signal and the second control signal according to a detection result thereof; and a mixer circuit configured to generate an output clock signal having a phase between a phase of the first input clock signal and a phase of the second input clock signal.

20 Claims, 8 Drawing Sheets

(56) References Cited

U.S. PATENT DOCUMENTS

| | | | |
|---|---|---|---|
| 7,230,465 B2* | 6/2007 | Kim | G06F 1/04 327/239 |
| 7,282,974 B2* | 10/2007 | Lee | H03L 7/087 327/158 |
| 7,560,963 B2* | 7/2009 | Yun | H03L 7/07 327/158 |
| 7,598,783 B2* | 10/2009 | Shin | H03L 7/087 327/158 |
| 7,629,829 B2* | 12/2009 | Lee | H03L 7/0812 327/410 |
| 7,969,213 B2* | 6/2011 | Kim | H03L 7/0816 327/158 |
| 8,674,733 B2* | 3/2014 | Kim | H03L 7/0814 327/158 |
| 9,912,328 B1* | 3/2018 | Ma | G11C 7/222 |
| 2007/0200604 A1* | 8/2007 | Yun | H03L 7/087 327/158 |
| 2007/0262798 A1* | 11/2007 | Yun | H03L 7/0816 327/158 |
| 2014/0211898 A1 | 7/2014 | Katoh | |
| 2016/0134266 A1* | 5/2016 | Cohen | H03L 7/0812 327/158 |
| 2018/0083607 A1* | 3/2018 | Kanomata | G06F 1/04 |
| 2023/0299758 A1* | 9/2023 | Fujimura | H03L 7/081 327/293 |

FOREIGN PATENT DOCUMENTS

| | | |
|---|---|---|
| JP | 2010-109560 A | 5/2010 |
| JP | 2010-109728 A | 5/2010 |
| JP | 2010-232868 A | 10/2010 |
| JP | 2012-231394 A | 11/2012 |
| JP | 2013-016985 A | 1/2013 |
| JP | 2014-146869 A | 8/2014 |
| JP | 2015-033094 A | 2/2015 |
| JP | 2018-504849 A | 2/2018 |
| JP | 2018-046489 A | 3/2018 |
| WO | 2013/108350 A1 | 7/2013 |

OTHER PUBLICATIONS

Written Opinion of the International Searching Authority dated Jan. 19, 2021 issued in International Patent Application No. PCT/JP2020/045100, with English translation of the relevant portion.

* cited by examiner

PHASE INTERPOLATION CIRCUIT, RECEPTION CIRCUIT, AND SEMICONDUCTOR INTEGRATED CIRCUIT

CROSS-REFERENCE TO RELATED APPLICATION

This application is a continuation application of International Application PCT/JP2020/045100 filed on Dec. 3, 2020, and designated the U.S., the entire contents of which are incorporated herein by reference.

FIELD

The embodiment discussed herein is directed to a phase interpolation circuit, a reception circuit, and a semiconductor integrated circuit.

BACKGROUND

Patent Document 1 has described a phase interpolation circuit including a first circuit, a second circuit, and a third circuit. The first circuit generates a first intermediate signal by weighting a plurality of first reference signals having different phases with a first ratio and combining the first weighted reference signals. The second circuit generates a second intermediate signal by weighting a plurality of second reference signals having phases different from the phases of a plurality of the first reference signals by a certain value with a second ratio equal to the first ratio and combining the weighted second reference signals. The third circuit generates an output signal by combining the first intermediate signal and the second intermediate signal.

Patent Document 2 has described a receiver that includes a low noise variable gain amplifier that amplifies an input signal, a mixer that performs a frequency conversion based on a local signal, a first detection means, a second detection means, and a mixer bias current supply means. The first detection means detects the signal strength of an output end of the low noise variable gain amplifier and controls the gain of the low noise variable gain amplifier. The second detection means detects the signal strength of the output end of the low noise variable gain amplifier and outputs a control signal for controlling the value of a mixer bias current to be supplied to the mixer. The mixer bias current supply means supplies the mixer bias current to the mixer based on the control signal.

Patent Document 3 has described a radio communication device that includes an antenna and a reception circuit that processes a radio signal received by the antenna. The reception circuit includes an amplifier that amplifies a radio signal, an oscillator that outputs an oscillation signal with a constant frequency, a mixer that receives and mixes outputs of the amplifier and the oscillator, and an AGC amplifier that adjusts the gain of a mixer output. An input voltage adjustment circuit adjusts the voltage of each input to the mixer according to the output of the AGC amplifier.

[Patent Document 1] Japanese Laid-open Patent Publication No. 2014-146869
[Patent Document 2] Japanese Laid-open Patent Publication No. 2010-109560
[Patent Document 3] Japanese Laid-open Patent Publication No. 2009-218931

In Patent Document 1, the first circuit generates the first intermediate signal by weighting a plurality of the first reference signals having different phases with the first ratio and combining the first weighted reference signals. When a rise time and a fall time of a plurality of the first reference signals are constant, the first intermediate signal is controlled to have an appropriate phase. However, the rise time and the fall time of a plurality of the first reference signals vary due to the effect of variations in process, power supply voltage, or temperature (PVT). As a result, the phase of the first intermediate signal varies, leading to a decrease in accuracy.

SUMMARY

A phase interpolation circuit includes: a first buffer circuit configured to adjust at least one of a rise time and a fall time of a first reference clock signal based on a first control signal to generate a first input clock signal; a second buffer circuit configured to adjust at least one of a rise time and a fall time of a second reference clock signal having a first phase difference from the first reference clock signal based on a second control signal to generate a second input clock signal; a detection circuit configured to detect at least one of a rise time and a fall time of at least one of the first input clock signal and the second input clock signal and generate the first control signal and the second control signal according to a detection result thereof; and a mixer circuit configured to generate an output clock signal having a phase between a phase of the first input clock signal and a phase of the second input clock signal based on the first input clock signal and the second input clock signal.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Figure 1:
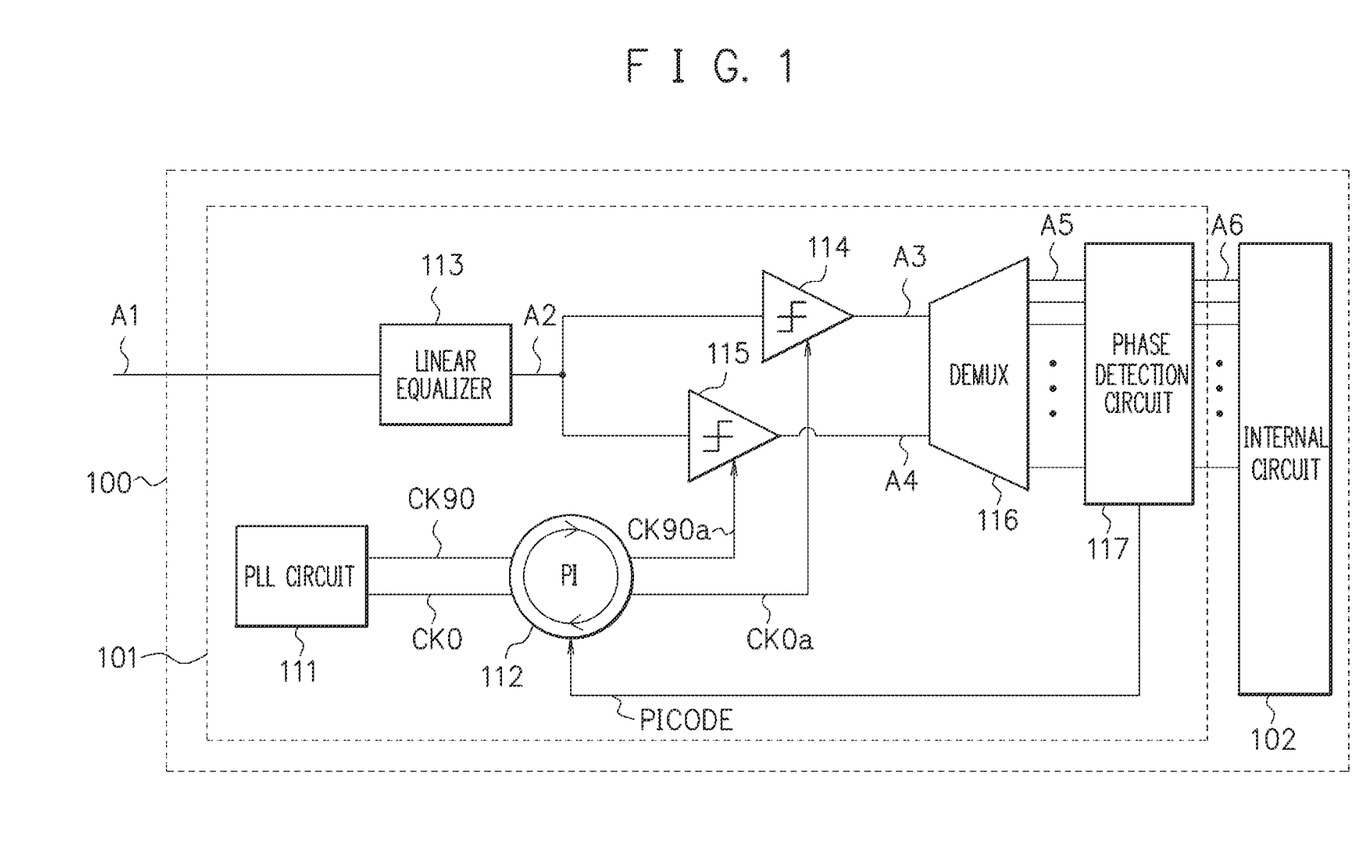
FIG. 1 is a diagram illustrating a configuration example of a semiconductor integrated circuit according to this embodiment.

FIG. 1 is a diagram illustrating a configuration example of a semiconductor integrated circuit 100 according to this embodiment. The semiconductor integrated circuit 100 includes a reception circuit 101 that outputs digital reception data A6 based on an analog reception signal A1, and an internal circuit 102 that processes the reception data A6.

The reception circuit 101 includes a phase locked loop circuit (PLL circuit) 111, a phase interpolation circuit 112, a linear equalizer 113, decision feedback equalizers (DFE circuits) 114, 115, a demultiplexer circuit 116, and a phase detection circuit 117.

The PLL circuit 111 generates a 0° reference clock signal CK0 and a 90° reference clock signal CK90 with a constant frequency by performing a feedback control so as to reduce the phase error between a base clock signal and a reference clock signal. The reference clock signal CK90 has the same frequency as the reference clock signal CK0, and is delayed in phase by 90° with respect to the reference clock signal CK0.

The phase interpolation circuit 112 adjusts the phase of an output clock signal CK0a and the phase of an output clock signal CK90a by performing interpolation using the reference clock signals CK0 and CK90 according to a phase adjustment code PICODE. The output clock signal CK90a has the same frequency as the output clock signal CK0a, and is delayed in phase by 90° with respect to the output clock signal CK0a.

The linear equalizer 113 receives the analog reception signal A1 and equalizes the reception signal A1, to thereby compensate for attenuation of the reception signal A1 on a transmission path and restore a reception signal A2.

The decision feedback equalizer 114 synchronizes with the output clock signal CK0a, determines and equalizes the reception signal A2, and outputs reception data A3. Specifically, the decision feedback equalizer 114 samples the level of the reception signal A2 near the center of an eye pattern at a timing of the rising edge or falling edge of the output clock signal CK0a, performs binary determination on the sampled level, and generates digital reception data A3 of 0 or 1. Further, the decision feedback equalizer 114 performs feedback control based on the reception data A3, performs equalization processing to suppress inter symbol interference of the reception signal A2, performs binary determination on the equalized reception signal A2, and generates the reception data A3.

The decision feedback equalizer 115 synchronizes with the output clock signal CK90a, determines and equalizes the reception signal A2, and outputs reception data A4. Specifically, the decision feedback equalizer 115 samples the level of the reception signal A2 near the boundary of the eye pattern at a timing of the rising edge or falling edge of the output clock signal CK90a, performs binary determination on the sampled level, and generates digital reception data A4 of 0 or 1. Further, the decision feedback equalizer 115 performs feedback control based on the reception data A4, performs equalization processing to suppress inter symbol interference of the reception signal A2, performs binary determination on the equalized reception signal A2, and generates the reception data A4.

The demultiplexer circuit 116 converts the reception data A3 and A4 into parallel data from serial data by demultiplexing, and outputs parallel reception data A5.

The phase detection circuit 117 outputs, of the parallel reception data A5, the parallel reception data corresponding to the reception data A3 near the center of the eye pattern to the internal circuit 102 as parallel reception data A6.

Further, the phase detection circuit 117 detects the phase of the reception data near the center of the eye pattern based on the reception data A5, and generates the phase adjustment code PICODE so that the difference between the phase of the reception data near the center of the eye pattern and the phase of the output clock signal CK0a decreases.

The phase interpolation circuit 112 adjusts the phase of the output clock signal CK0a and the phase of the output clock signal CK90a according to the phase adjustment code PICODE. Thereby, the phase of the output clock signal CK0a is adjusted near the center of the eye pattern of the reception signal A2. The phase of the output clock signal CK90a is adjusted near the boundary of the eye pattern of the reception signal A2. Therefore, the phase adjustment operation by the phase interpolation circuit 112 needs high accuracy.

Figure 2:
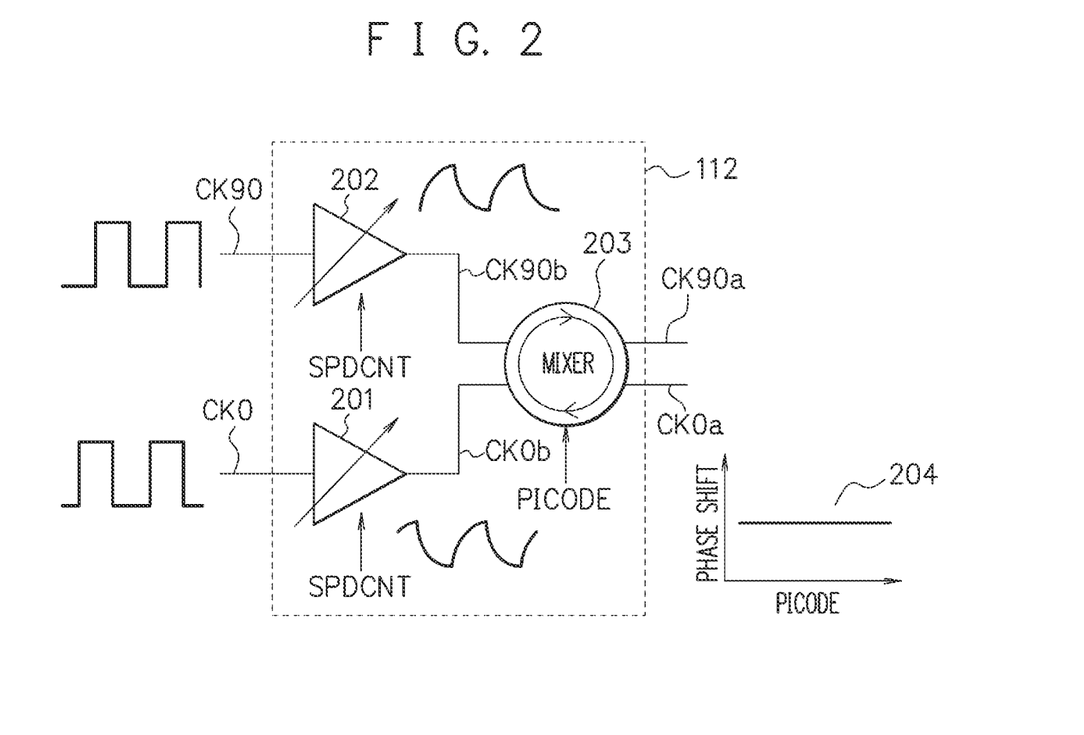
FIG. 2 is a diagram illustrating phase shift amount characteristics of an output clock signal when a rise time and a fall time of an input clock signal are long.
Figure 3:
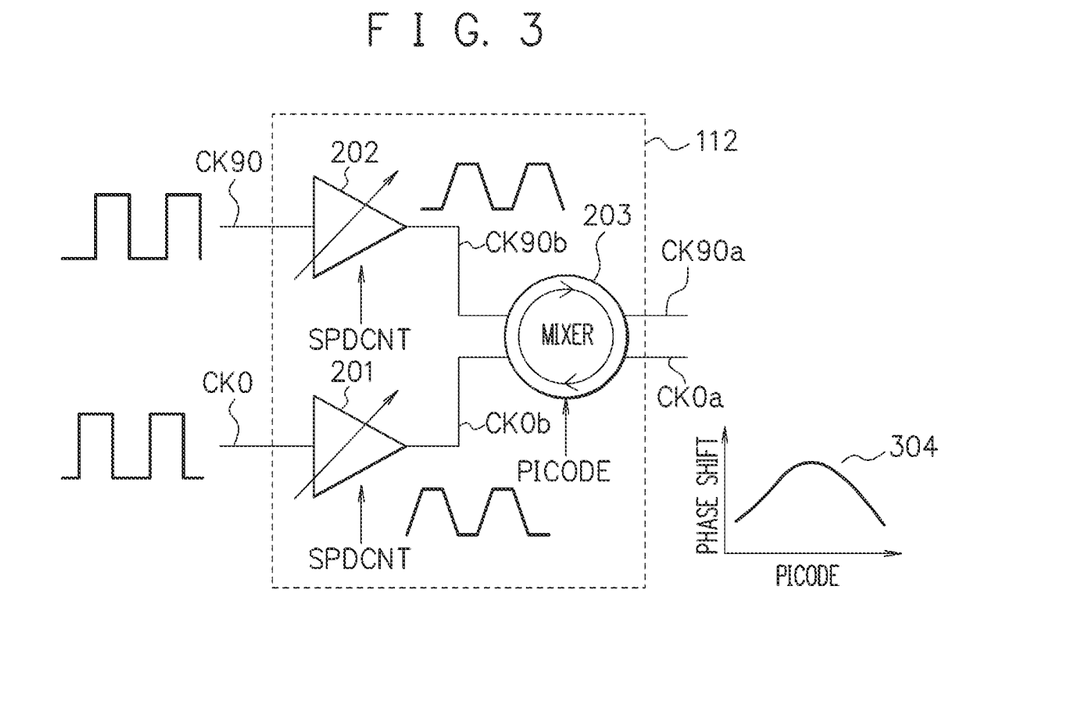
FIG. 3 is a diagram illustrating phase shift amount characteristics of the output clock signal when the rise time and the fall time of the input clock signal are short.

FIG. 2 and FIG. 3 are views each illustrating a configuration example of the phase interpolation circuit 112 in FIG. 1. The phase interpolation circuit 112 includes a buffer circuit 201, a buffer circuit 202, and a mixer circuit 203. The reference clock signal CK90 has a phase difference of 90° from the reference clock signal CK0.

The buffer circuit 201 adjusts at least one of the rise time and the fall time of the reference clock signal CK0 based on a control signal SPDCNT, to thereby generate an input clock signal CK0b. At least one of the rise time and the fall time of the input clock signal CK0b is determined by the control signal SPDCNT.

The buffer circuit 202 adjusts at least one of the rise time and the fall time of the reference clock signal CK90 based on the control signal SPDCNT, to thereby generate an input clock signal CK90b. At least one of the rise time and the fall time of the input clock signal CK90b is determined by the control signal SPDCNT.

The mixer circuit 203 generates the output clock signals CK0a and CK90a each having a phase corresponding to the phase adjustment code PICODE based on the input clock signal CK0b and the input clock signal CK90b. Specifically, the mixer circuit 203 performs weighted addition on the input clock signals CK0b and CK90b according to the phase adjustment code PICODE to generate the output clock signal CK0a having a phase between the phase of the input clock signal CK0b and the phase of the input clock signal CK90b. Further, the mixer circuit 203 performs weighted addition on the input clock signals CK90b and CK0b according to the phase adjustment code PICODE to generate the output clock signal CK90a having a phase between the phase of the input clock signal CK90b and the phase of the input clock signal CK0b. As described above, the mixer circuit 203 can adjust the phases of the output clock signals CK0a and CK90a according to the phase adjustment code PICODE.

Here, at least one of the rise times and the fall times of the input clock signals CK0b and CK90b are lengthened or shortened by the control signal SPDCNT.

FIG. 2 is a diagram illustrating phase shift amount characteristics 204 of the output clock signals CK0a and CK90a when the rise times and the fall times of the input clock signals CK0b and CK90b are long. In this case, the phase shift amount characteristics 204 are such that the phase shift amounts of the output clock signals CK0a and CK90a are constant with respect to the phase adjustment code PICODE. That is, the phase interpolation circuit 112 can linearly adjust the phases of the output clock signals CK0a and CK90a according to the phase adjustment code PICODE. As a result, the phase adjustment accuracy of the phase interpolation circuit 112 becomes high. Incidentally, in order to linearly adjust the phases of the output clock signals CK0a and CK90a according to the phase adjustment code PICODE, the input clock signals CK0b and CK90b are sine waves ideally.

FIG. 3 is a diagram illustrating phase shift amount characteristics 304 of the output clock signals CK0a and CK90a when the rise times and the fall times of the input clock signals CK0b and CK90b are short. In this case, the phase shift amount characteristics 304 are such that the phase shift amounts of the output clock signals CK0a and CK90a are not constant with respect to the phase adjustment code PICODE. That is, the phase interpolation circuit 112 fails to linearly adjust the phases of the output clock signals CK0a and CK90a according to the phase adjustment code PICODE. As a result, the phase adjustment accuracy of the phase interpolation circuit 112 becomes low. As illustrated in FIG. 2, the rise times and the fall times of the input clock signals CK0b and CK90b are preferably long.

As in the phase shift amount characteristics 204 in FIG. 2, the control signal SPDCNT is adjusted so that the phase shift amounts of the output clock signals CK0a and CK90a are substantially constant with respect to the phase adjustment code PICODE.

However, due to the effect of variations in process, power supply voltage, or temperature (PVT), the rise times and the fall times of the input clock signals CK0b and CK90b vary. As a result, the phases of the output clock signals CK0a and CK90a vary, leading to a decrease in accuracy.

Figure 4:
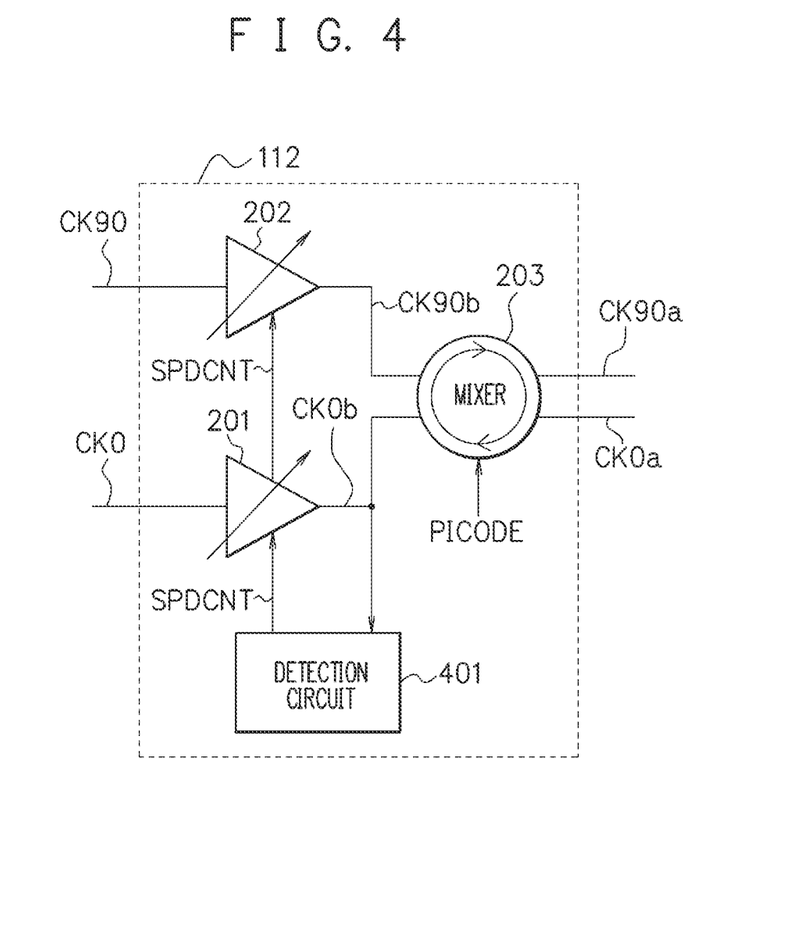
FIG. 4 is a diagram illustrating a configuration example of a phase interpolation circuit according to this embodiment.

With reference to FIG. 4, there is explained the phase interpolation circuit 112 that is capable of preventing variations in the rise times or the fall times of the input clock signals CK0b and CK90b of the mixer circuit 203 caused by the effect of variations in process, power supply voltage, or temperature, and improving the accuracy of the phase adjustment operation in the mixer circuit 203.

FIG. 4 is a diagram illustrating a configuration example of the phase interpolation circuit 112 according to this embodiment. The phase interpolation circuit 112 includes the buffer circuit 201, the buffer circuit 202, the mixer circuit 203, and a detection circuit 401. The reference clock signal CK90 has a phase difference of 90° from the reference clock signal CK0.

The buffer circuit 201 adjusts at least one of the rise time and the fall time of the reference clock signal CK0 based on the control signal SPDCNT, to thereby generate the input clock signal CK0b. At least one of the rise time and the fall time of the input clock signal CK0b is determined by the control signal SPDCNT.

The buffer circuit 202 adjusts at least one of the rise time and the fall time of the reference clock signal CK90 based on the control signal SPDCNT, to thereby generate the input clock signal CK90b. At least one of the rise time and the fall time of the input clock signal CK90b is determined by the control signal SPDCNT.

The detection circuit 401 detects at least one of the rise time and the fall time of the input clock signal CK0b and generates the control signal SPDCNT according to the detection result. Incidentally, the detection circuit 401 detects at least one of the rise time and the fall time of at least one of the input clock signal CK0b and the input clock signal CK90b, and generates the control signal SPDCNT according to the detection result.

Specifically, the detection circuit 401 generates the control signal SPDCNT so that at least one of the rise time and the fall time of at least one of the input clock signal CK0b and the input clock signal CK90b is between a first threshold value and a second threshold value.

The buffer circuits 201 and 202 adjust at least one of the rise times and the fall times of the input clock signal CK0b and the input clock signal CK90b respectively, based on the control signal SPDCNT.

The mixer circuit 203 generates the output clock signals CK0a and CK90a each having a phase corresponding to the phase adjustment code PICODE based on the input clock signal CK0b and the input clock signal CK90b. Specifically, the mixer circuit 203 performs weighted addition on the input clock signals CK0b and CK90b according to the phase adjustment code PICODE to generate the output clock signal CK0a having a phase between the phase of the input clock signal CK0b and the phase of the input clock signal CK90b. Further, the mixer circuit 203 performs weighted addition on the input clock signals CK90b and CK0b according to the phase adjustment code PICODE to generate the output clock signal CK90a having a phase between the phase of the input clock signal CK90b and the phase of the input clock signal CK0b. As above, the mixer circuit 203 can adjust the phases of the output clock signals CK0a and CK90a according to the phase adjustment code PICODE.

As above, providing the detection circuit 401 makes it possible to prevent variations in the rise times or the fall times of the input clock signals CK0b and CK90b caused by the effect of variations in process, power supply voltage, or temperature, and improve the accuracy of the phase adjustment operation in the mixer circuit 203.

Figure 5:
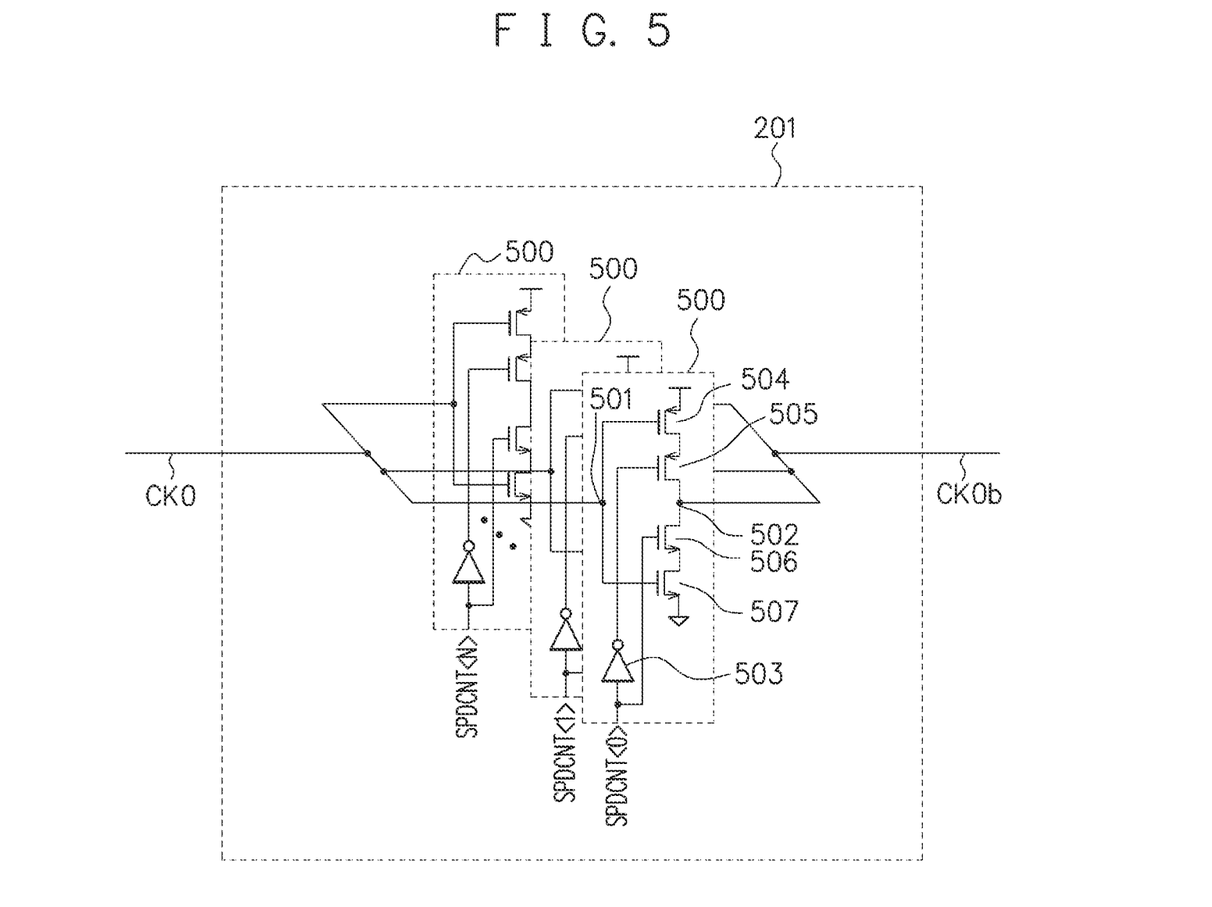
FIG. 5 is a circuit diagram illustrating a configuration example of a buffer circuit in FIG. 4.

FIG. 5 is a circuit diagram illustrating a configuration example of the buffer circuit 201 in FIG. 4. Incidentally, the buffer circuit 202 in FIG. 4 also has the same configuration as that of the buffer circuit 201. There is explained, as an example, the configuration of the buffer circuit 201 below.

The buffer circuit 201 includes N inverter circuits 500. N-bit control signals SPDCNT<0> to SPDCNT<N> correspond to the control signal SPDCNT in FIG. 4.

Each of the N inverter circuits 500 includes an input node 501, an output node 502, an inverter circuit 503, p-channel field-effect transistors 504, 505, and n-channel field-effect transistors 506, 507. The input nodes 501 of the N inverter circuits 500 are mutually connected and receive the reference clock signal CK0. The output nodes 502 of the N inverter circuits 500 are mutually connected and output the input clock signal CK0b. The inverter circuit 503 outputs a signal obtained by logically inverting one of the control signals SPDCNT<0> to SPDCNT<N>.

The p-channel field-effect transistor 504 has a source thereof connected to a power supply potential node, has a gate thereof connected to the input node 501, and has a drain thereof connected to a source of the p-channel field-effect transistor 505. The p-channel field-effect transistor 505 has a gate thereof connected to an output terminal of the inverter circuit 503 and has a drain thereof connected to the output node 502.

The n-channel field-effect transistor 506 has a drain thereof connected to the output node 502, has a gate thereof connected to a node of one of the control signals SPDCNT<0> to SPDCNT<N>, and has a source thereof connected to a drain of the n-channel field-effect transistor 507. The n-channel field-effect transistor 507 has a gate thereof connected to the input node 501 and has a source thereof connected to a reference potential node (for example, a ground potential node).

When the control signals SPDCNT<0> to SPDCNT<N> are 1, the inverter circuits 500 are activated to be in an operable state. In contrast, when the control signals SPDCNT<0> to SPDCNT<N> are 0, the inverter circuits 500 are deactivated to be in an inoperable state.

The buffer circuits 201 and 202 each control the number of parallel connections of the N inverter circuits 500 based on the N-bit control signals SPDCNT<0> to SPDCNT<N>. As the number of signals of 1 among the control signals SPDCNT<0> to SPDCNT<N> increases, the number of parallel connections of the inverter circuits 500 increases. As the number of parallel connections of the inverter circuits 500 increases, the driving capability of the buffer circuits 201 and 202 increases, and the rise times and the fall times of the input clock signals CK0*b* and CK90*b* become shorter.

As above, the buffer circuits 201 and 202 can adjust the rise times and the fall times of the input clock signals CK0*b* and CK90*b* respectively, based on the control signals SPDCNT<0> to SPDCNT<N>.

Figure 6:
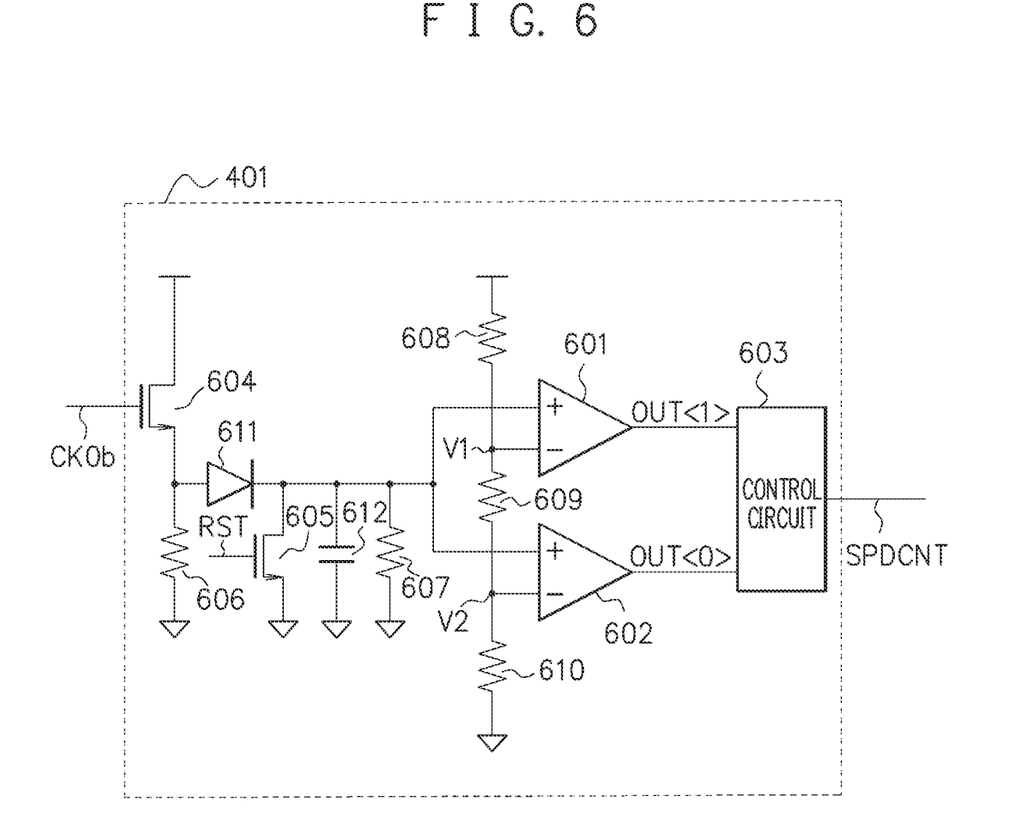
FIG. 6 is a circuit diagram illustrating a configuration example of a detection circuit in FIG. 4.

FIG. 6 is a circuit diagram illustrating a configuration example of the detection circuit 401 in FIG. 4. The detection circuit 401 includes comparison circuits 601, 602, a control circuit 603, n-channel field-effect transistors 604, 605, resistors 606 to 610, a diode 611, and a capacitor 612.

The n-channel field-effect transistor 604 has a drain thereof connected to the power supply potential node, has a gate thereof connected to the node of the input clock signal CK0*b*, and has a source thereof connected to an anode of the diode 611. The resistor 606 is connected between the anode of the diode 611 and the reference potential node.

The n-channel field-effect transistor 605 has a drain thereof connected to a cathode of the diode 611, has a gate thereof connected to a node of a reset signal RST, and has a source thereof connected to the reference potential node.

The capacitor 612 is connected between the cathode of the diode 611 and the reference potential node. The resistor 607 is connected between the cathode of the diode 611 and the reference potential node. A + input terminal of the comparison circuit 601 and a + input terminal of the comparison circuit 602 are connected to the cathode of the diode 611.

The resistor 608 is connected between the power supply potential node and a − input terminal of the comparison circuit 601. The resistor 609 is connected between the − input terminal of the comparison circuit 601 and a − input terminal of the comparison circuit 602. The resistor 610 is connected between the − input terminal of the comparison circuit 602 and the reference potential node.

Next, there is explained an operation of the detection circuit 401. The n-channel field-effect transistor 604 accumulates the amount of charge corresponding to the voltage of the input clock signal CK0*b* in the capacitor 612 through the diode 611. The capacitor 612 holds, for example, a voltage corresponding to the voltage obtained by integrating the voltage of the input clock signal CK0*b* from the start of rising of the input clock signal CK0*b* to immediately before the start of falling of the input clock signal CK0*b*. That is, the voltage of the capacitor 612 is a voltage corresponding to the area of the voltage waveform from the start of rising of the input clock signal CK0*b* to immediately before the start of falling of the input clock signal CK0*b*. As the rise time of the input clock signal CK0*b* is shorter, the area of the voltage waveform from the start of rising of the input clock signal CK0*b* to immediately before the start of falling of the input clock signal CK0*b* becomes larger and the voltage of the capacitor 612 becomes higher. That is, the voltage of the capacitor 612 is a voltage corresponding to the rise time of the input clock signal CK0B, and the detection circuit 401 can detect the rise time of the input clock signal CK0B, for example.

Incidentally, when the reset signal RST becomes 1, the n-channel field-effect transistor 605 is turned on to reset the charge (voltage) accumulated in the capacitor 612. For example, the reset signal RST becomes 0 at a timing corresponding to the start of rising of the input clock signal CK0*b*, the n-channel field-effect transistor 605 is turned off, and the reset of the voltage of the capacitor 612 is released.

A threshold voltage V1 corresponding to the resistors 609 and 610 is applied to the − input terminal of the comparison circuit 601. A threshold voltage V2 corresponding to the resistor 610 is applied to the − input terminal of the comparison circuit 602. The threshold voltage V2 is lower than the threshold voltage V1.

The comparison circuit 601 outputs an output signal OUT<1> of 1 when the voltage of the capacitor 612 is higher than the threshold voltage V1, and outputs an output signal OUT<1> of 0 when the voltage of the capacitor 612 is lower than the threshold voltage V1.

The comparison circuit 602 outputs an output signal OUT<0> of 1 when the voltage of the capacitor 612 is higher than the threshold voltage V2, and outputs an output signal OUT<0> of 0 when the voltage of the capacitor 612 is lower than the threshold voltage V2.

The control circuit 603 generates the control signals SPDCNT<0> to SPDCNT<N> based on the output signals OUT<0> and OUT<1>.

When the voltage of the capacitor 612 is lower than the threshold voltage V1 and the threshold voltage V2, the output signals OUT<0> and OUT<1> are 0. This means that the rise time of the input clock signal CK0*b* is longer than the first threshold value and the second threshold value. In this case, the control circuit 603 modifies the control signals SPDCNT<0> to SPDCNT<N> so that the number of signals of 1 among the control signals SPDCNT<0> to SPDCNT<N> increases. As a result, the buffer circuits 201 and 202 perform control to make the rise times of the input clock signals CK0*b* and CK90*b* short.

When the voltage of the capacitor 612 is higher than the threshold voltage V1 and the threshold voltage V2, the output signals OUT<0> and OUT<1> are 1. This means that the rise time of the input clock signal CK0*b* is shorter than the first threshold value and the second threshold value. In this case, the control circuit 603 modifies the control signals SPDCNT<0> to SPDCNT<N> so that the number of signals of 1 among the control signals SPDCNT<0> to SPDCNT<N> decreases. As a result, the buffer circuits 201 and 202 perform control to make the rise times of the input clock signals CK0*b* and CK90*b* long.

When the voltage of the capacitor 612 is higher than the threshold voltage V1 and lower than the threshold voltage V2, the output signal OUT<0> is 1 and the output signal OUT<1> is 0. This means that the rise time of the input clock signal CK0*b* is the time between the first threshold value and the second threshold value. In this case, the control circuit 603 maintains the control signals SPDCNT<0> to SPDCNT<N>. As a result, the rise times of the input clock signals CK0*b* and CK90*b* are substantially constant regardless of the process, power supply voltage, or temperature.

The detection circuit 401 operates with calibration when the reception circuit 101 is powered on, for example, and then stops operating and fixes the control signals SPDCNT<0> to SPDCNT<N>.

Figure 7:
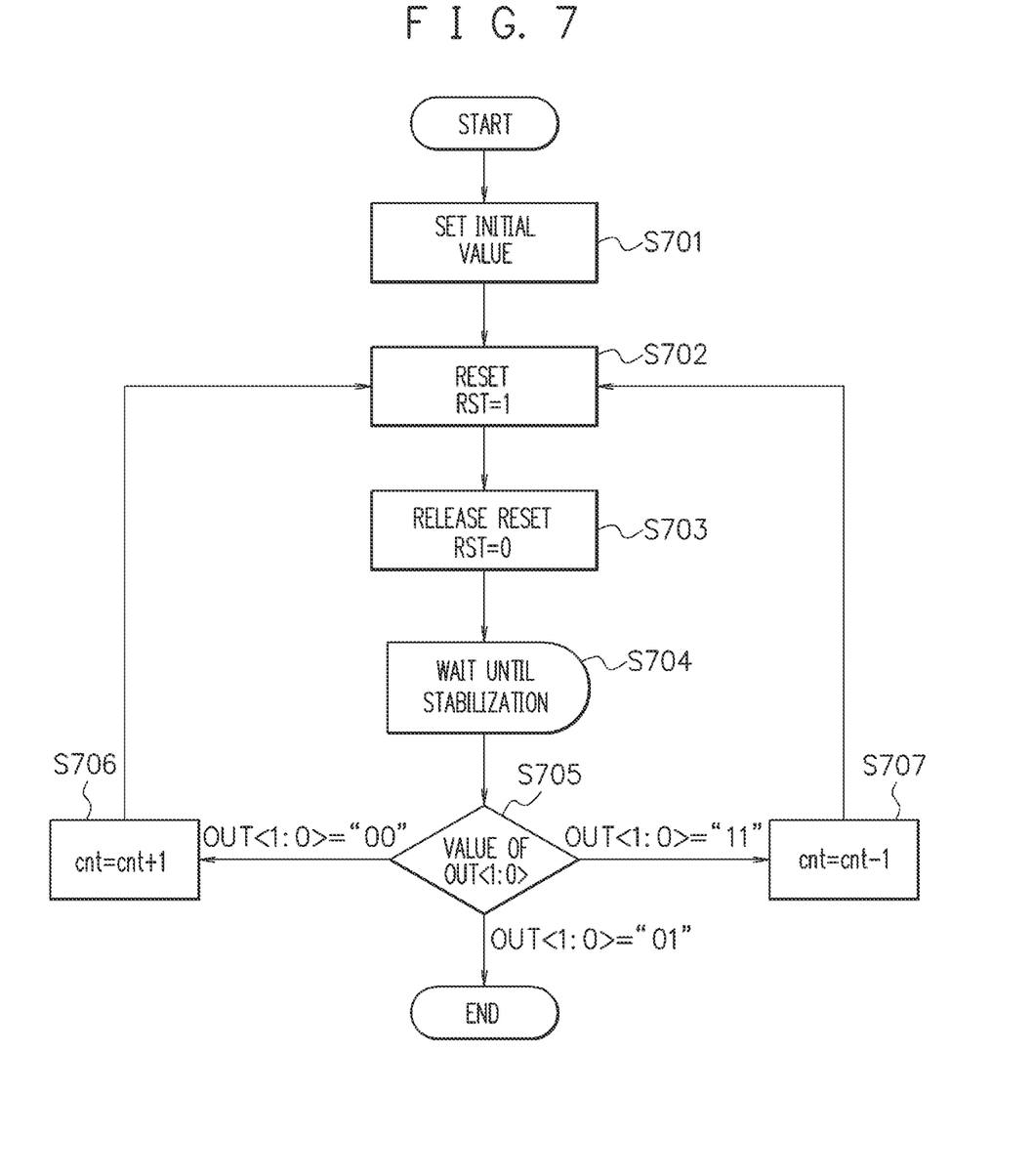
FIG. 7 is a flowchart for explaining an operation of the detection circuit in FIG. 6.

FIG. 7 is a flowchart for explaining the operation of the detection circuit 401 in FIG. 6. At Step S701, the control circuit 603 sets the control signals SPDCNT<0> to SPDCNT<N> and a variable cnt to initial values. The variable cnt represents the number of signals of 1 among the control signals SPDCNT<0> to SPDCNT<N>.

Then, at Step S702, the control circuit 603 sets the reset signal RST to 1. Then, the n-channel field-effect transistor 605 is turned on to reset the voltage of the capacitor 612 to 0 V.

Then, at Step S703, the control circuit 603 sets the reset signal RST to 0. Then, the n-channel field-effect transistor 605 is turned off to release the reset of the voltage of the capacitor 612. The control circuit 603 operates based on the reference clock signal CK0, for example, and at a timing corresponding to the start of rising of the input clock signal CK0b, the control circuit 603 sets the reset signal RST to 0 and releases the reset of the voltage of the capacitor 612.

Then, at Step S704, the control circuit 603 waits until the voltage of the capacitor 612 stabilizes, and when the voltage of the capacitor 612 stabilizes, the control circuit 603 proceeds to Step S705. The control circuit 603 operates based on the reference clock signal CK0, for example, and waits until a timing corresponding to immediately before the start of falling of the input clock signal CK0b.

At Step S705, the control circuit 603 determines the values of the output signals OUT<0> and OUT<1>. When the output signals OUT<0> and OUT<1> are 0, the voltage of the capacitor 612 is lower than the threshold voltage V1 and the threshold voltage V2, and thus, the processing proceeds to Step S706. When the output signals OUT<0> and OUT<1> are 1, the voltage of the capacitor 612 is higher than the threshold voltage V1 and the threshold voltage V2, and thus, the processing proceeds to Step S707.

At Step S706, the control circuit 603 increments the variable cnt, modifies the control signals SPDCNT<0> to SPDCNT<N> so that the number of signals of 1 among the control signals SPDCNT<0> to SPDCNT<N> becomes the variable cnt, returns to Step S702, and performs the above-described processing repeatedly. As the variable cnt increases, the rise times and the fall times of the input clock signals CK0b and CK90b become shorter and the voltage of the capacitor 612 rises.

At Step S707, the control circuit 603 decrements the variable cnt, modifies the control signals SPDCNT<0> to SPDCNT<N> so that the number of signals of 1 among the control signals SPDCNT<0> to SPDCNT<N> becomes the variable cnt, returns to Step S702, and performs the above-described processing repeatedly. As the variable cnt decreases, the rise times and the fall times of the input clock signals CK0b and CK90b become longer and the voltage of the capacitor 612 falls.

When the output signal OUT<0> is 1 and the output signal OUT<1> is 0 at Step S705, the voltage of the capacitor 612 is higher than the threshold voltage V1 and lower than the threshold voltage V2, which is within a proper range, and thus, the control circuit 603 fixes the control signals SPDCNT<0> to SPDCNT<N> and finishes the processing of the flowchart in FIG. 7.

With the processing in FIG. 7, the rise times and the fall times of the input clock signals CK0b and CK90b are substantially constant regardless of the process, power supply voltage, or temperature.

Figure 8:
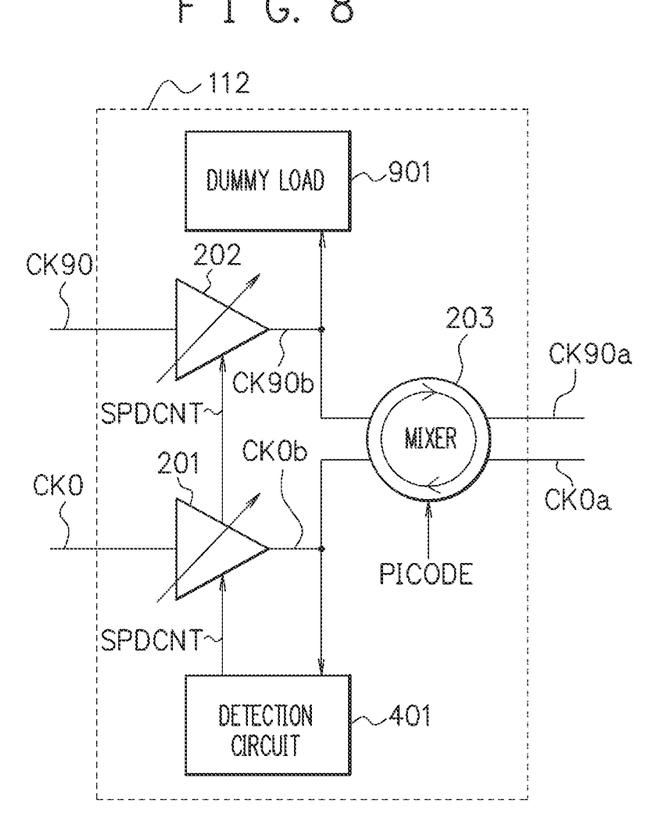
FIG. 8 is a diagram illustrating another configuration example of the phase interpolation circuit according to this embodiment.

FIG. 8 is a diagram illustrating another configuration example of the phase interpolation circuit 112 according to this embodiment. The phase interpolation circuit 112 in FIG. 8 is that a dummy load circuit 901 is added to the phase interpolation circuit 112 in FIG. 4. The following is an explanation of how the phase interpolation circuit 112 in FIG. 8 differs from the phase interpolation circuit 112 in FIG. 4.

In the phase interpolation circuit 112 in FIG. 4, the detection circuit 401 is connected to the output terminal of the buffer circuit 201, and the detection circuit is not connected to the output terminal of the buffer circuit 202. Therefore, the output load of the buffer circuit 201 is different in weight from the output load of the buffer circuit 202. As a result, the difference between the rise time of the input clock signal CK0b output by the buffer circuit 201 and the rise time of the input clock signal CK90b output by the buffer circuit 202 is equal to or more than a predetermined value in some cases.

The difference between the rise time of the input clock signal CK0b and the rise time of the input clock signal CK90b is preferably less than a predetermined value. The phase interpolation circuit 112 in FIG. 8 enables the difference between the rise time of the input clock signal CK0b and the rise time of the input clock signal CK90b to be less than a predetermined value.

The phase interpolation circuit 112 in FIG. 8 includes the buffer circuit 201, the buffer circuit 202, the mixer circuit 203, the detection circuit 401, and the dummy load circuit 901. The dummy load circuit 901 is a dummy circuit of the detection circuit 401 and has the same configuration as the detection circuit 401 in FIG. 6. In the dummy load circuit 901, the gate of the n-channel field-effect transistor 604 is connected to the output terminal of the buffer circuit 202 (node of the input clock signal CK90b), and the output terminal of the control circuit 603 is not connected to the terminals of the control signals SPDCNT of the buffer circuits 201 and 202.

In the detection circuit 401, as in FIG. 4, the gate of the n-channel field-effect transistor 604 is connected to the output terminal of the buffer circuit 201 (node of the input clock signal CK0b), and the output terminal of the control circuit 603 is connected to the terminals of the control signals SPDCNT of the buffer circuits 201 and 202.

In the phase interpolation circuit 112 in FIG. 8, the detection circuit 401 is connected to the output terminal of the buffer circuit 201 and the dummy load circuit 901 is connected to the output terminal of the buffer circuit 202. Therefore, the output load of the buffer circuit 201 is the same in weight as the output load of the buffer circuit 202. As a result, the rise time of the input clock signal CK0b output by the buffer circuit 201 and the rise time of the input clock signal CK90b output by the buffer circuit 202 are substantially the same.

Figure 9:
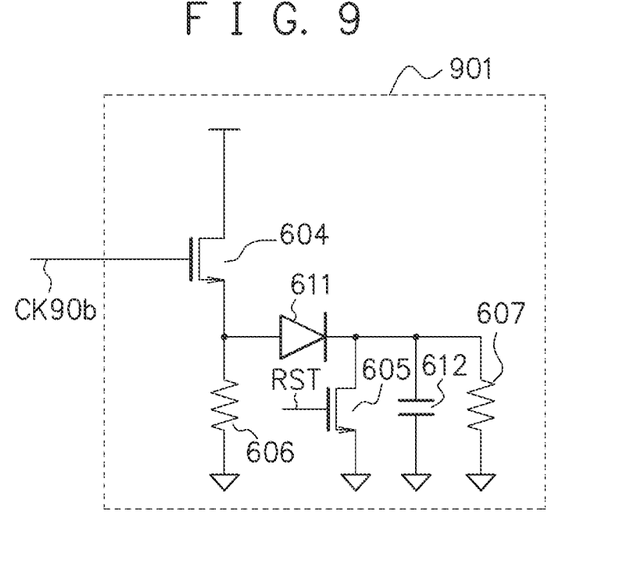
FIG. 9 is a diagram illustrating another configuration example of a dummy load circuit in FIG. 8.

FIG. 9 is a diagram illustrating another configuration example of the dummy load circuit 901 in FIG. 8. The dummy load circuit 901 is that the resistors 608 to 610, the comparison circuits 601, 602, and the control circuit 603 are deleted from the detection circuit 401 in FIG. 6. The dummy load circuit 901 is a dummy circuit with a load equivalent to that of the detection circuit 401 and includes the n-channel field-effect transistors 604, 605, the resistors 606, 607, the diode 611, and the capacitor 612. The dummy load circuit 901 is a circuit with a load equivalent to that of the detection circuit 401, and thus, the rise time of the input clock signal CK0b output by the buffer circuit 201 and the rise time of the input clock signal CK90b output by the buffer circuit 202 are substantially the same.

Figure 10:
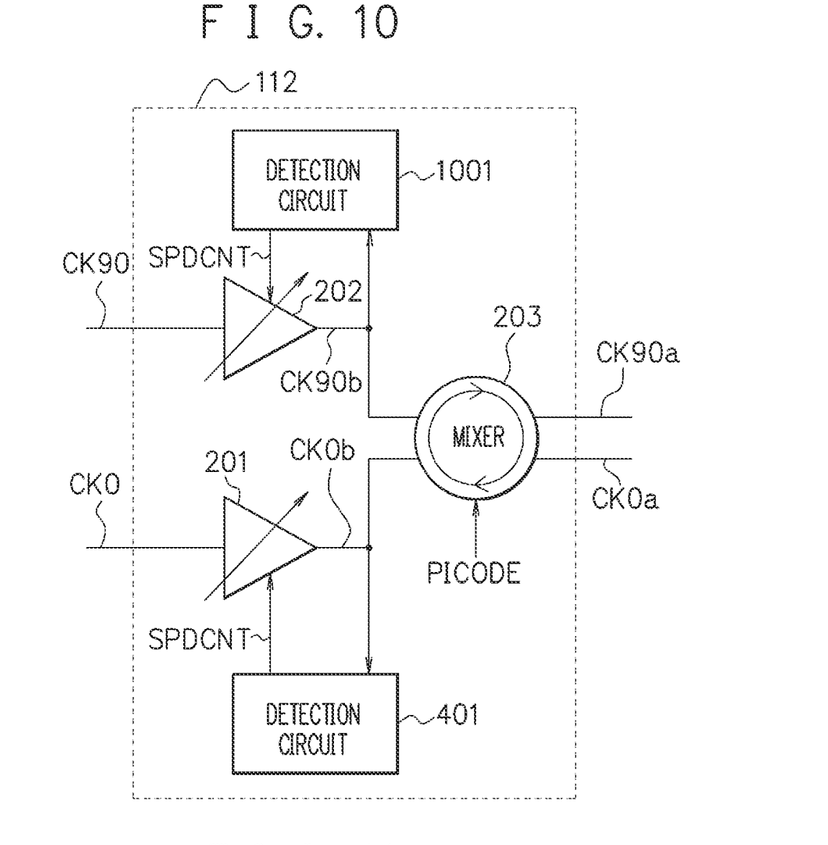
FIG. 10 is a diagram illustrating still another configuration example of the phase interpolation circuit according to this embodiment.

FIG. 10 is a diagram illustrating still another configuration example of the phase interpolation circuit 112 according to this embodiment. The phase interpolation circuit 112 in FIG. 10 is that a detection circuit 1001 is added to the phase interpolation circuit 112 in FIG. 4. The following is an explanation of how the phase interpolation circuit 112 in FIG. 10 differs from the phase interpolation circuit 112 in FIG. 4.

The detection circuit 401 detects at least one of the rise time and the fall time of the input clock signal CK0b, generates the control signal SPDCNT according to the detection result, and outputs the control signal SPDCNT only to the buffer circuit 201 and does not output it to the buffer circuit 202. The buffer circuit 201 adjusts at least one of the rise time and the fall time of the reference clock signal CK0 based on the control signal SPDCNT output by the detection circuit 401, to thereby generate the input clock signal CK0b.

The detection circuit 1001 has the same configuration as the detection circuit 401 in FIG. 6. The detection circuit 1001 detects at least one of the rise time and the fall time of the input clock signal CK90b, generates the control signal SPDCNT according to the detection result, and outputs the control signal SPDCNT to the buffer circuit 202. The buffer circuit 202 adjusts at least one of the rise time and the fall time of the reference clock signal CK90 based on the control signal SPDCNT output by the detection circuit 1001, to thereby generate the input clock signal CK90b.

The detection circuit 401 is connected to the output terminal of the buffer circuit 201, and the detection circuit 1001 is connected to the output terminal of the buffer circuit 202. Therefore, the output load of the buffer circuit 201 is the same in weight as the output load of the buffer circuit 202. As a result, the rise time of the input clock signal CK0b output by the buffer circuit 201 and the rise time of the input clock signal CK90b output by the buffer circuit 202 are substantially the same.

Figure 11:
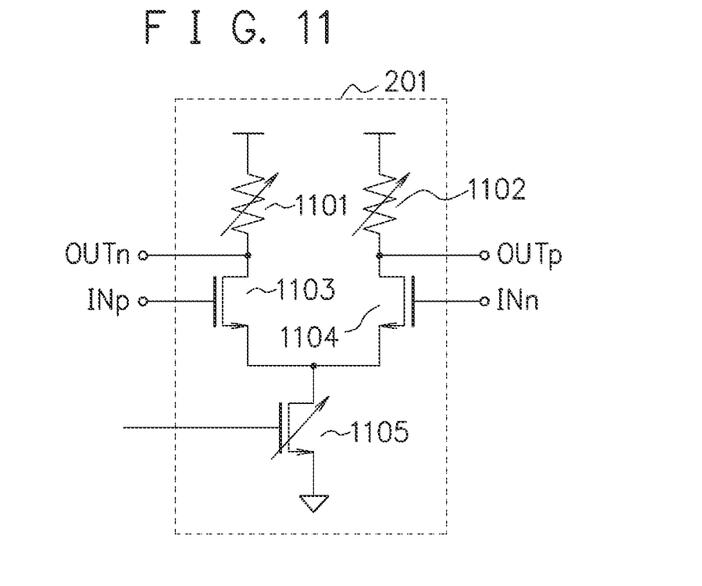
FIG. 11 is a diagram illustrating another configuration example of the buffer circuit according to this embodiment.

FIG. 11 is a diagram illustrating another configuration example of the buffer circuit 201 according to this embodiment. The buffer circuit 202 also has the same configuration as the buffer circuit 201. The buffer circuits 201 and 202 each are a current mode logic buffer circuit (CML buffer circuit). There is explained, as an example, the configuration of the buffer circuit 201 below.

The buffer circuit 201 includes resistors 1101, 1102, n-channel field-effect transistors 1103 to 1105, differential input terminals INp, INn, and differential output terminals OUTp, OUTn.

The differential input terminals INp and INn receive a differential signal of the reference clock signal CK0 in FIG. 4. The differential output terminals OUTp and OUTn output a differential signal of the input clock signal CK0b in FIG. 4. The n-channel field-effect transistor 1105 is a current source. The n-channel field-effect transistors 1103 and 1104 are a differential input pair.

The resistor 1101 is connected between the power supply potential node and the differential output terminal OUTn. The n-channel field-effect transistor 1103 has a drain thereof connected to the differential output terminal OUTn, has a gate thereof connected to the differential input terminal INp, and has a source thereof connected to a drain of the n-channel field-effect transistor 1105.

The resistor 1102 is connected between the power supply potential node and the differential output terminal OUTp. The n-channel field-effect transistor 1104 has a drain thereof connected to the differential output terminal OUTp, has a gate thereof connected to the differential input terminal INn, and has a source thereof connected to the drain of the n-channel field-effect transistor 1105.

The n-channel field-effect transistor 1105 is a current source, and has a gate thereof connected to a node of a bias voltage and has a source thereof connected to the reference potential node.

As in the example of the buffer circuit 201 in FIG. 5, in the buffer circuit 201 in FIG. 11, the N-bit control signals SPDCNT<0> to SPDCNT<N> are multi-bit digital signals. The resistors 1101 and 1102 are each formed of a plurality of pairs of a fixed resistor and a transistor, the transistor whose gate is connected to the node of any one of the control signals SPDCNT<0> to SPDCNT<N>, connected in parallel. The re-channel field-effect transistor 1105 is formed of a plurality of pairs of transistors connected in parallel, which are the transistor whose gate is fixed at a constant bias voltage and the transistor whose gate is connected to the node of any one of the control signals SPDCNT<0> to SPDCNT<N>. Then, by the control signals SPDCNT<0> to SPDCNT<N>, the number of parallel connections of the fixed resistors of the resistor 1101, the number of parallel connections of the fixed resistors of the resistor 1102, and the number of parallel connections of the transistors fixed at the bias voltage of the n-channel field-effect transistor 1105 are controlled, and thereby, the driving current is controlled while keeping the output voltage level constant. As the number of parallel connections of the transistors fixed at the bias voltage of the n-channel field-effect transistor 1105 increases, the driving capability of the buffer circuits 201 and 202 increases and the rise times and the fall times of the input clock signals CK0b and CK90b become shorter.

Incidentally, the above embodiment merely illustrate concrete examples of implementing the present invention, and the technical scope of the present invention is not to be construed in a restrictive manner by the embodiment. That is, the present invention may be implemented in various forms without departing from the technical spirit or main features thereof.

It is possible to prevent variations in the rise time or the fall time of an input clock signal of a mixer circuit caused by the effect of variations in process, power supply voltage, or temperature and improve the accuracy of a phase adjustment operation in the mixer circuit.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A phase interpolation circuit, comprising:
   a first buffer circuit configured to adjust at least one of a rise time and a fall time of a first reference clock signal based on a first control signal to generate a first input clock signal;
   a second buffer circuit configured to adjust at least one of a rise time and a fall time of a second reference clock signal having a first phase difference from the first reference clock signal based on a second control signal to generate a second input clock signal;
   a detection circuit configured to detect at least one of a rise time and a fall time of at least one of the first input clock signal and the second input clock signal and generate the first control signal and the second control signal according to a detection result thereof; and
   a mixer circuit configured to generate an output clock signal having a phase between a phase of the first input clock signal and a phase of the second input clock signal based on the first input clock signal and the second input clock signal.

2. The phase interpolation circuit according to claim 1, wherein
   the detection circuit is configured to detect at least one of a rise time and a fall time of the first input clock signal and generate the first control signal and the second control signal according to a detection result thereof, and the first control signal and the second control signal are the same signals as each other.

3. The phase interpolation circuit according to claim 2, comprising a dummy circuit of the detection circuit, the dummy circuit being connected to an output terminal of the second buffer circuit, wherein the detection circuit is connected to an output terminal of the first buffer circuit.

4. The phase interpolation circuit according to claim 3, wherein the dummy circuit is a circuit having a load equivalent to a load of the detection circuit.

5. The phase interpolation circuit according to claim 1, wherein the detection circuit further includes:

a first detection circuit configured to detect at least one of a rise time and a fall time of the first input clock signal and generate the first control signal according to a detection result thereof; and a second detection circuit configured to detect at least one of a rise time and a fall time of the second input clock signal and generate the second control signal according to a detection result thereof.

6. The phase interpolation circuit according to claim 1, wherein the detection circuit is configured to generate the first control signal and the second control signal so that at least one of a rise time and a fall time of at least one of the first input clock signal and the second input clock signal is between a first threshold value and a second threshold value.

7. The phase interpolation circuit according to claim 1, wherein the first buffer circuit includes a plurality of first inverter circuits connected in parallel, and the first buffer circuit is configured to control the number of parallel connections of the first inverter circuits based on the first control signal; and the second buffer circuit includes a plurality of second inverter circuits connected in parallel, and the second buffer circuit is configured to control the number of parallel connections of the second inverter circuits based on the second control signal.

8. The phase interpolation circuit according to claim 1, wherein the first buffer circuit and the second buffer circuit are a current mode logic buffer circuit, respectively, and the first buffer circuit and the second buffer circuit are configured to control driving currents based on the first control signal and the second control signal, respectively.

9. A reception circuit, comprising:

a phase interpolation circuit configured to generate an output clock signal;

a decision feedback equalizer circuit configured to synchronize with the output clock signal, determine and equalize a reception signal, and output reception data; and a demultiplexer circuit configured to convert the reception data output from the decision feedback equalizer circuit into parallel data from serial data, wherein the phase interpolation circuit includes:

a first buffer circuit configured to adjust at least one of a rise time and a fall time of a first reference clock signal based on a first control signal to generate a first input clock signal;

a second buffer circuit configured to adjust at least one of a rise time and a fall time of a second reference clock signal having a first phase difference from the first reference clock signal based on a second control signal to generate a second input clock signal;

a detection circuit configured to detect at least one of a rise time and a fall time of at least one of the first input clock signal and the second input clock signal and generate the first control signal and the second control signal according to a detection result thereof; and a mixer circuit configured to generate an output clock signal having a phase between a phase of the first input clock signal and a phase of the second input clock signal based on the first input clock signal and the second input clock signal.

10. The reception circuit according to claim 9, wherein the detection circuit is configured to detect at least one of a rise time and a fall time of the first input clock signal and generate the first control signal and the second control signal according to a detection result thereof, and the first control signal and the second control signal are the same signals as each other.

11. The reception circuit according to claim 10, comprising a dummy circuit of the detection circuit, the dummy circuit being connected to an output terminal of the second buffer circuit, wherein the detection circuit is connected to an output terminal of the first buffer circuit.

12. The reception circuit according to claim 11, wherein the dummy circuit is a circuit having a load equivalent to a load of the detection circuit.

13. The reception circuit according to claim 9, wherein the detection circuit further includes:

a first detection circuit configured to detect at least one of a rise time and a fall time of the first input clock signal and generate the first control signal according to a detection result thereof; and a second detection circuit configured to detect at least one of a rise time and a fall time of the second input clock signal and generate the second control signal according to a detection result thereof.

14. The reception circuit according to claim 9, wherein the detection circuit is configured to generate the first control signal and the second control signal so that at least one of a rise time and a fall time of at least one of the first input clock signal and the second input clock signal is between a first threshold value and a second threshold value.

15. A semiconductor integrated circuit, comprising:

a reception circuit configured to output reception data; and an internal circuit configured to process the reception data, wherein the reception circuit includes:

a phase interpolation circuit configured to generate an output clock signal;

a decision feedback equalizer circuit configured to synchronize with the output clock signal, determine and equalize a reception signal, and output the reception data; and a demultiplexer circuit configured to convert the reception data output from the decision feedback equalizer into parallel data from serial data, the phase interpolation circuit includes:
a first buffer circuit configured to adjust at least one of a rise time and a fall time of a first reference clock signal based on a first control signal to generate a first input clock signal;
a second buffer circuit configured to adjust at least one of a rise time and a fall time of a second reference clock signal having a first phase difference from the first reference clock signal based on a second control signal to generate a second input clock signal;
a detection circuit configured to detect at least one of a rise time and a fall time of at least one of the first input clock signal and the second input clock signal and generate the first control signal and the second control signal according to a detection result thereof; and
a mixer circuit configured to generate an output clock signal having a phase between a phase of the first input clock signal and a phase of the second input clock signal based on the first input clock signal and the second input clock signal.

16. The semiconductor integrated circuit according to claim 15, wherein
the detection circuit is configured to detect at least one of a rise time and a fall time of the first input clock signal and generate the first control signal and the second control signal according to a detection result thereof, and
the first control signal and the second control signal are the same signals as each other.

17. The semiconductor integrated circuit according to claim 16, comprising a dummy circuit of the detection circuit, the dummy circuit being connected to an output terminal of the second buffer circuit,
wherein the detection circuit is connected to an output terminal of the first buffer circuit.

18. The semiconductor integrated circuit according to claim 17, wherein
the dummy circuit is a circuit having a load equivalent to a load of the detection circuit.

19. The semiconductor integrated circuit according to claim 15, wherein
the detection circuit further includes:
a first detection circuit configured to detect at least one of a rise time and a fall time of the first input clock signal and generate the first control signal according to a detection result thereof; and
a second detection circuit configured to detect at least one of a rise time and a fall time of the second input clock signal and generate the second control signal according to a detection result thereof.

20. The semiconductor integrated circuit according to claim 15, wherein
the detection circuit is configured to generate the first control signal and the second control signal so that at least one of a rise time and a fall time of at least one of the first input clock signal and the second input clock signal is between a first threshold value and a second threshold value.

* * * * *